United States Patent
Anthes et al.

(10) Patent No.: US 6,783,704 B1
(45) Date of Patent: Aug. 31, 2004

(54) METHOD AND AGENT FOR PRODUCING HYDROPHOBIC LAYERS ON FLUORIDE LAYERS

(75) Inventors: Uwe Anthes, Erbach (DE); Reiner Dombrowski, Höchst (DE); Martin Friz, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 09/959,982

(22) PCT Filed: Apr. 26, 2000

(86) PCT No.: PCT/EP00/03707

§ 371 (c)(1),
(2), (4) Date: Nov. 14, 2001

(87) PCT Pub. No.: WO00/69785

PCT Pub. Date: Nov. 23, 2000

(30) Foreign Application Priority Data

May 15, 1999 (DE) .......................................... 199 22 523

(51) Int. Cl.$^7$ ............................ C23C 14/12; B32B 3/26
(52) U.S. Cl. ........................... 252/512; 264/104; 241/3; 118/726; 106/605; 106/640; 106/672; 106/677; 428/446; 427/166; 427/243; 427/244; 427/255.6
(58) Field of Search ................................ 427/162, 166, 427/566, 585, 587, 593, 596, 255.14, 255.6, 243, 244, 245; 359/580, 581, 582; 118/723 EB, 723 VE, 726; 106/640, 672, 677, 122, 605; 524/546; 241/3; 264/104; 252/512; 428/402, 403, 426, 446, 450, 694 BF

(56) References Cited

U.S. PATENT DOCUMENTS

| | | | | |
|---|---|---|---|---|
| 4,410,563 A | * | 10/1983 | Richter et al. | 427/108 |
| 4,863,762 A | * | 9/1989 | Aramaki et al. | 427/525 |
| 4,931,311 A | * | 6/1990 | Singh et al. | 427/199 |
| 5,594,231 A | | 1/1997 | Pellicori et al. | |
| 5,744,227 A | * | 4/1998 | Bright et al. | 428/216 |
| 5,851,674 A | | 12/1998 | Invie et al. | |
| 5,853,800 A | * | 12/1998 | Dombrowski et al. | 427/162 |
| 5,874,801 A | * | 2/1999 | Kobayashi et al. | 313/478 |
| 5,882,773 A | * | 3/1999 | Chow et al. | 428/212 |
| 6,266,193 B1 | * | 7/2001 | Saif et al. | 359/582 |
| 6,296,793 B1 | * | 10/2001 | Anthes et al. | 264/104 |

FOREIGN PATENT DOCUMENTS

| | | | |
|---|---|---|---|
| EP | 0770699 A | | 5/1997 |
| JP | 59-35358 A | * | 2/1984 |
| JP | 63-228101 A | * | 9/1988 |
| JP | 03266801 A | | 11/1991 |
| JP | 06340966 A | | 12/1994 |

* cited by examiner

Primary Examiner—Shrive P. Beck
Assistant Examiner—Wesley D. Markham
(74) Attorney, Agent, or Firm—Millen, White, Zelano, Branigan, P.C.

(57) ABSTRACT

Process for the production of hydrophobic layers on optical substrates which have an alkaline earth metal fluoride or alkali metal fluoride layer as the outermost layer or consist of alkaline earth metal fluorides or alkali metal fluorides, by thermal vapor deposition with polyfluorohydrocarbons in a high vacuum.

13 Claims, No Drawings

METHOD AND AGENT FOR PRODUCING HYDROPHOBIC LAYERS ON FLUORIDE LAYERS

The invention relates to a process and composition for the production of hydrophobic layers on fluoride substrates or on fluoride layers by vacuum vapour deposition.

In optics, antireflection layers are applied to optical components, for example lenses, spectacle lenses, objectives, binoculars, prisms and mirrors, in order to reduce reflection. Substrates made from mineral glass are frequently provided with a magnesium fluoride coating or a triple coating with the layer sequence aluminium oxide—zirconium oxide or high-refractive-index mixed oxides, such as titanium oxide/lanthanum oxide—magnesium fluoride as antireflection layer. However, these layers are very sensitive to soiling, for example by fingerprints. In addition, they are difficult to clean since the surface of the vapour-deposited magnesium layers has a certain roughness.

However, windows made from fluorides, for example magnesium fluoride, calcium fluoride, barium fluoride or lithium fluoride, are frequently also used in optics. The surfaces of these components must likewise be protected against soiling, scratching and adsorption of water by an additional coating.

Water- and dirt-repellent coatings for optical components are known. DE 195 39 789 describes a process and composition for the production of water-repellent coatings on optical substrates by thermal vapour deposition with fluorinated organosilane compounds in a high vacuum. On oxide layers, strongly adherent and durable protective layers are obtained which exhibit very good resistance to wiping and scratching and have high stability to warm humid air, physiological saline solution and UV radiation. DE 198 25 100, which was not published before the priority date of the present application, describes a composition for the production of water-repellent coatings on optical layers which consists of a porous, electrically conductive moulding and a fluorinated organosilane. This composition has the advantage that, owing to its electrical conductivity, it can be employed without problems in an electron-beam evaporator and precisely controllable evaporation of the organosilicon compounds is possible.

The said processes and compositions have the disadvantage that they cannot be used to produce strongly adherent layers on magnesium fluoride and other alkaline earth metal or alkali metal fluorides.

The property of polyfluorohydrocarbons of forming water- and dirt-repellent surfaces is known from coating technology. As a consequence of their high chemical and heat resistance, they are employed as coating material in chemical apparatus construction. It has also been attempted to use polyfluorohydrocarbons for interference layers on optical substrates.

R. Chow et al., Proc. SPIE 2253 (1994) 512, describe attempts to produce interference layers by evaporation of PTFE copolymer from boats in a high vacuum. The layers obtained are described as very soft, heat-sensitive and unusable for interference layers.

The object of the invention is to provide a process and composition which allows the production of strongly adherent and wipe-stable water- and dirt-repellent layers on alkaline earth metal fluoride and alkali metal fluoride layers.

This object is achieved in accordance with the invention by a process for the production of hydrophobic coatings on optical substrates which have an alkaline earth metal fluoride or alkali metal fluoride layer as the outermost layer or consist of alkaline earth metal fluorides or alkali metal fluorides, by thermal vapour deposition with polyfluorohydrocarbons in a high vacuum.

This object is furthermore achieved in accordance with the invention by a composition for the production of hydrophobic layers on alkaline earth metal fluoride and alkali metal fluoride layers, comprising a porous, inorganic moulding and a polyfluorohydrocarbon, obtainable by a) mixing a metal oxide or a silicate with an aqueous suspension of a polyfluorohydrocarbon with addition of water in a ratio of from 99:1 to 80:20, b) drying the pasty material at from 60 to 120° C. and subsequently heating the material at from 250 to 400° C. in air, and c) granulating and tabletting the resultant solid.

This object is furthermore achieved in accordance with the invention by a composition for the production of hydrophobic layers on alkaline earth metal fluoride and alkali metal fluoride layers, comprising a porous, electrically conductive moulding and a polyfluorohydrocarbon, obtainable by a) mixing a metal oxide or a silicate with a metal powder and an aqueous suspension of a polyfluorohydrocarbon with addition of water in a ratio of from 90:10:1 to 20:80:30, b) drying the pasty material at from 60 to 120° C. and subsequently heating the material at from 250 to 400° C. in air, and c) granulating and tabletting the resultant solid.

The invention also relates to optical substrates having a coating applied by vapour deposition in a high vacuum using the composition according to the invention.

The invention furthermore relates to the use of polyfluorohydrocarbons for the production of hydrophobic layers on optical substrates which consist of alkali metal fluorides or alkaline earth metal fluorides.

The invention also relates to the use of polyfluorohydrocarbons for the production of hydrophobic coatings on optical substrates which have been provided in advance with thin layers for surface coating and/or reflection reduction, where the outermost layer consists of alkali metal fluorides or alkaline earth metal fluorides.

The polyfluorohydrocarbons employed are known and commercially available. Preference is given to polytetrafluoroethylene (PTFE) and perfluoroalkoxy polymers (PFAs). The latter result from the copolymerization of tetrafluoroethylene and perfluoroalkoxy vinyl ethers.

It has been found that the polyfluorohydrocarbons can readily be evaporated in a high vacuum by heating to from 400 to 500° C. under a pressure of from $10^{-3}$ to $10^{-5}$ mbar, during which they precipitate on the substrate with the formation of thin layers. Layer thicknesses of from 5 to 20 nm are necessary.

The process according to the invention can be carried out using high-vacuum vapour deposition units, as are usual for the production of optical layers, such as, in particular, antireflection layers or coating layers for surface hardening.

The polyfluorohydrocarbons here are introduced into the unit in a suitable form and manner, for example as granules, in addition to the usual vapour-deposition materials. The polyfluorohydrocarbons are evaporated from a conventional boat which is heated by direct passage of current or by bombardment with an electron beam. It is advantageous to carry out the vapour-deposition step directly after the preceding vapour-deposition processes, for example for application of antireflection layers. Particularly durable layers are obtained if the substrate is heated to temperatures of up to 300° C.

The hydrophobic layers can be applied to interference layers, for example antireflection layers, filters, beam splitters or other optical components or layers. These layers consist either of a single low-refractive-index layer of magnesium fluoride or another alkaline earth metal fluoride or alkali metal fluoride or of a sequence of high- and low-refractive-index layers, where the outermost layer is formed from magnesium fluoride or another alkaline earth metal fluoride or alkali metal fluoride. The hydrophobic layers can furthermore be applied to single-crystal sheets of fluorides, such as magnesium fluoride, barium fluoride or lithium fluoride, for example for optical windows. After the coating layers have been applied, further pretreatment of the substrates before the vapour-deposition with the polyfluorohydrocarbons is unnecessary.

The polyfluorohydrocarbons are usually introduced into the vapour-deposition unit in conventional boats. A particularly advantageous form of introduction of the polyfluorohydrocarbons into the vapour-deposition unit is a porous inorganic moulding.

It has been found that porous mouldings of metal oxides or silicates, which may additionally contain metal powder, are very highly suitable as support materials for polyfluorohydrocarbons, and the polyfluorohydrocarbons can be evaporated from this support material at a very readily controllable rate by heating, in particular also using an electron beam. For the purposes of the invention, the term "moulding" is taken to mean granules having a particle size of from 1 to 4 mm and tablets having a diameter of from 5 to 25 mm and a thickness of from 3 to 15 mm.

The metal oxides used for the porous mouldings are silicon dioxide, aluminium oxide, zirconium oxide, magnesium oxide or mixtures of these oxides. The silicates employed are aluminium silicates, preference being given to mullite. The mouldings comprise from 15 to 90% by weight of these metal oxides or silicates. The particle size of the metal oxides or silicates is from 0.5 to 50 $\mu$m.

The second component of the porous mouldings consists of powders of the metals silicon, titanium or chromium. The metal powders have particle sizes of from 5 to 50 $\mu$m. The mouldings comprise from 10 to 65% by weight of these metals.

The polyfluorohydrocarbons can be used as a powder or as an aqueous suspension. However, preference is given to aqueous suspensions which are commercially available, since this makes the preparation of a homogeneous mixture with the two other components easier. The content of polyfluorohydrocarbons in the mouldings is from 1 to 25% by weight, preferably from 5 to 15% by weight.

The process according to the invention can be used for the production of strongly adherent and wipe-stable hydrophobic layers on alkaline earth metal fluoride and alkali metal fluoride layers. The layers produced form a contact angle of from 100 to 130° with water. Water drops run off the layer in the form of beads. Dirt, such as, for example, fingerprints, can easily be wiped off.

The examples below are intended to illustrate the invention without representing a limitation.

EXAMPLE 1

A mixture is prepared from 90% by weight of mullite (aluminium silicate) and 10% by weight of PFA. The PFA is used as an aqueous suspension having a solids content of 50% by weight. In order to improve the miscibility, water is added until a pasty material is formed. The material is dried and subsequently heated at 350° C. in air. The mixture is then granulated and tabletted, giving tablets having a diameter of 13 mm and a thickness of 7 mm.

EXAMPLE 2

A mixture is prepared from 54% by weight of mullite, 36% by weight of silicon powder and 10% by weight of PFA in the form of a powder. In order to improve the miscibility, water is added until a pasty material is formed. The material is dried at 80° C. and subsequently granulated and tabletted.

EXAMPLE 3

In a conventional vapour-deposition unit (L560 from Leybold Systems), glass sheets to be coated are mounted, after prior cleaning, on a substrate carrier and heated to 280° C. The unit is then evacuated to a residual pressure of $2 \times 10^{-5}$ mbar. An antireflection layer system consisting of aluminium oxide (layer thickness: 78 nm), zirconium oxide (layer thickness: 124 nm) and magnesium fluoride (layer thickness: 92 nm) is subsequently applied. A tablet produced as described in Example 1 is then introduced into the evaporation device in a boat and heated to 480° C. The PFA present in the tablet evaporates and precipitates on the glass sheets, forming a layer. During this operation, the temperature of the substrate is still held at 280°C. The coated glasses are subsequently allowed to cool and are removed from the unit. The layer thickness on the substrates is measured as 15 nm. The vapour-deposited hydrophobic layer is strongly adherent, is stable to wiping and is durable. The contact angle with water is 120°, and only changes a little after wiping with a dry cotton cloth, after wiping with an alcohol-soaked cloth, after storage in a warm, humid atmosphere or after boiling in water for 10 minutes.

What is claimed is:

1. A composition for the production of hydrophobic layers on optical substrates which have an alkaline earth metal fluoride or alkali metal fluoride layer as the outermost layer or consist of alkaline earth metal fluorides or alkali metal fluorides, wherein the composition comprises a porous, electrically conductive, inorganic moulding and a polyfluorohydrocarbon and is obtained by a method comprising:

a) mixing a metal oxide or a silicate with a metal powder and a polyfluorohydrocarbon in a weight ratio, solid weight basis, of from 90:10:1 to 20:80:30, with the addition of water, to obtain a pasty material, b) drying the pasty material at from 60 to 120° C. and subsequently heating the material at from 250 to 400° C. in air, and c) granulating and tabletting the resultant solid.

2. A composition according to claim 1, wherein the polyfluorohydrocarbon is polytetrafluoroethylene or a perfluoroalkoxy polymer.

3. A composition according to claim 2, wherein, in step a), a metal oxide is mixed which is a silicon dioxide, aluminum oxide, zirconium oxide, magnesium oxide or a mixture of these oxides.

4. A composition according to claim 2, wherein, in step a), a silicate is mixed which is an aluminum silicate.

5. A composition according to claim 2, wherein the metal powder is a silicon, titanium or chromium powder.

6. A composition according to claim 1, wherein, in step a), a metal oxide is mixed which is a silicon dioxide, aluminum oxide, zirconium oxide, magnesium oxide or a mixture of these oxides.

7. A composition according to claim 6, wherein the metal powder is a silicon, titanium or chromium powder.

8. A composition according to claim 1, wherein, in step a), a silicate is mixed which is an aluminum silicate.

9. A composition according to claim 8, wherein the metal powder is a silicon, titanium or chromium powder.

10. A composition according to claim 1, wherein the metal powder is a silicon, titanium or chromium powder.

11. A composition according to claim 1, wherein the polyfluorohydrocarbon in step a) is provided in the form of an aqueous suspension.

12. A composition according to claim 1, wherein the metal oxide or silicate in step a) has a particle size of 0.5 to 50 $\mu$m.

13. A composition according to claim 1, wherein the metal powder in step a) has a particle size of 5 to 50 $\mu$m.

* * * * *